United States Patent
Schubert et al.

(10) Patent No.: US 8,496,221 B2
(45) Date of Patent: Jul. 30, 2013

(54) AEROSTATICALLY GUIDED TABLE SYSTEM FOR VACUUM APPLICATION

(75) Inventors: Gerhard Schubert, Jena (DE); Christian Jackel, Droyssig (DE); Ulf-Carsten Kirschstein, Jena (DE); Michael Boehm, Jena (DE); René Bauer, Jena (DE); Gerd Harnisch, Jena (DE); Thomas Peschel, Jena (DE); Stefan Risse, Jena (DE); Christoph Schenk, Jena (DE)

(73) Assignee: Vistec Electron Beam GmbH, Jena (DE)

( * ) Notice: Subject to any disclaimer, the term of this patent is extended or adjusted under 35 U.S.C. 154(b) by 926 days.

(21) Appl. No.: 12/618,839

(22) Filed: Nov. 16, 2009

(65) Prior Publication Data
US 2010/0122603 A1 May 20, 2010

(30) Foreign Application Priority Data
Nov. 17, 2008 (DE) .......................... 10 2008 058 306

(51) Int. Cl.
*F16C 32/06* (2006.01)

(52) U.S. Cl.
USPC ............................. 248/580; 108/137; 318/560

(58) Field of Classification Search
USPC .................. 248/580, 581, 584, 585; 318/560, 318/568.12, 568.11; 108/137, 143; 384/7, 384/9, 12
See application file for complete search history.

(56) References Cited

U.S. PATENT DOCUMENTS

| | | | |
|---|---|---|---|
| 4,547,024 A * | 10/1985 | Teramachi ..................... 384/45 |
| 5,140,242 A | 8/1992 | Doran et al. |
| 6,324,933 B1 | 12/2001 | Waskiewicz et al. |
| 6,499,880 B2 | 12/2002 | Tsuda et al. |
| 6,679,455 B2 * | 1/2004 | Chatenet .................... 244/171.2 |
| 6,778,260 B2 * | 8/2004 | Blaesing-Bangert et al. .. 355/72 |
| 7,535,552 B2 * | 5/2009 | Sakino ............................ 355/72 |
| 7,707,907 B2 * | 5/2010 | Bonev ........................ 74/490.08 |
| 8,267,582 B2 * | 9/2012 | Schubert et al. ................ 384/12 |
| 2002/0034345 A1 | 3/2002 | Tsuda et al. |
| 2008/0166213 A1 | 7/2008 | Hunter |

FOREIGN PATENT DOCUMENTS

| | | |
|---|---|---|
| EP | 1235115 A2 | 8/2002 |
| JP | 59101834 A | 6/1984 |
| JP | 2001052988 A | 2/2001 |
| WO | 2008/001069 A2 | 1/2008 |

* cited by examiner

*Primary Examiner* — Steven Marsh
(74) *Attorney, Agent, or Firm* — Patentbar International P.C.

(57) ABSTRACT

A table system for vacuum application has a base plate and a moving table guided by aerostatic bearing units. The bearing units (10) are connected to supply lines and suction lines for supplying and extracting the gas required for the operation of the bearing units and are provided in each instance with a sealing system having at least one stage and comprising suction channel and sealing gap for sealing relative to the vacuum. The table system is characterized in that the aerostatic bearing units (10) are constructed at least partially as swivel joints, and a push rod (4) which is actuated by a drive (5) for guiding the moving table laterally is connected to the rotating part (21) of each swivel joint, and in that the push rods (4) are hollow and constitute a component part of the suction lines for extracting the operating gas.

17 Claims, 3 Drawing Sheets

AEROSTATICALLY GUIDED TABLE SYSTEM FOR VACUUM APPLICATION

RELATED APPLICATIONS

This application claims priority to German Patent Application No. DE 10 2008 058 306.5, filed Nov. 17, 2008, which is incorporated herein by reference in its entirety.

FIELD OF THE INVENTION

The invention is directed to a table system for vacuum application in accordance with the preamble of the main claim.

BACKGROUND OF THE INVENTION

Table systems of this kind are known in general, for example, from EP 1 235 115 A2 and U.S. Pat. No. 6,499,880 B2. The gas-guided or air-guided tables known from these references which are suitable for use in a vacuum environment usually comprise two axes which are oriented, for example, in x-direction and y-direction and can move under high-vacuum conditions. Gas bearing elements or air bearing elements are used, for example, on a fixed base plate, for virtually frictionless movement. Usually, slides are movable on guide rails, e.g., in the form of bars, along one axis, e.g., the x-axis, and a connection rail, e.g., in the form of a crossbar, is arranged between these slides in direction of the other axis along which another slide runs, this slide carrying a stage plate arrangement.

U.S. Pat. No. 5,140,242 discloses a table system with three rotatable drives in which a moving table is rotatably and swivelably connected to three drive rods, each drive rod being moved by a drive roller and pinch rollers connected to a motor.

SUMMARY OF THE INVENTION

It is the object of the invention to provide a table system for vacuum application in which the kinematics of the drive system, as parallel kinematics, differ from the prior art and which permits precise positioning. In particular, a smaller moving mass which is coupled with high rigidity offers advantages with respect to the dynamics of the system which make the parallel kinematics approach stand out from the conventional serial approach.

According to the invention, the above-stated object is met by a table system for vacuum application having the features of the main claim.

Advantageous further developments and improvements are made possible through the steps indicated in the dependent claims.

A parallel kinematics linkage is formed in that the aerostatic bearing units of the table system are constructed at least partially as swivel joints, and a push rod which is actuated by a drive for guiding the moving table laterally in x-direction and y-direction is connected to the part of each swivel joint rotating around the z-axis, and in that the push rods are hollow and constitute a component part of the suction lines for extracting the operating gas for the aerostatic bearing units. In this way, the moving table which is supported relative to a base structure by aerostatic bearing elements integrated in the aerostatic bearing units can be accurately positioned at any location. Short suction line lengths can be implemented and the transmission of constraint forces to the moving table through pipe lines can be prevented in that the sucked out gases are removed through the push rods whose free ends advantageously terminate in second vacuum chambers, or secondary chambers, which are separated with respect to pressure from the first vacuum chamber with moving table, or main chamber, by a seal and through which the gas flowing out of the push rods is extracted by associated vacuum pumps.

Exactly three aerostatic bearing units acting as swivel joints and guide elements are advantageously arranged at a torsionally rigid frame construction. Each of the swivel joints has a part, e.g., shaped as a double-T considered in axial cross section, which is stationary with respect to the frame construction, and the rotatable part is a rotatable ring which is arranged around the central area as axial part and which is supported at least radially, advantageously both radially and axially, relative to the stationary part by aerostatic bearings with an associated sealing system. By arranging an aerostatic axial bearing at both front sides of the rotatable ring, this rotatable ring is received within the bearing unit with very high axial rigidity because the axial bearings are mutually preloaded. Accordingly, an aerostatic bearing unit advantageously carries out multiple functions. The suction channels of the sealing system of the respective aerostatic bearing elements are connected within the bearing units by lines so that a compact construction is achieved.

In two-stage sealing systems for sealing against different pressures, two push rods advantageously conduct the gas at a lower pressure and one push rod conducts the gas at a higher pressure. In this way it is possible to double the suction capacity of the suction stage at lower pressure, which has a positive influence on the leakage rate of the aerostatic bearing units. This step optimizes outlay on pipe lines. However, it is also possible to use the third push rod for purposes other than discharging the operating gas, e.g., to supply other media to the moving table. Also, it is possible to divide individual push rods into a plurality of lines in order to supply other media to the moving table.

In a particularly advantageous manner, each push rod is connected to the rotatable part, i.e., the center ring of the bearing unit, by a coupling element which permits rotation and torsion because this prevents unwanted movements brought about by tolerances in the manufacture of the push rod and drive and in the alignment of the drive with respect to the moving table from being transmitted to the moving table. For this purpose, the coupling element comprises a swivel joint and a torsion joint.

In a particularly advantageous embodiment form, a preferably electrostatic preloading device is arranged at the side of the frame construction facing the base plate for applying a force acting between the preloading device and the base plate. Improved static and dynamic properties of the moving table can be achieved by means of this preloading device.

A rotatably supported friction wheel gear unit which is driven by a motor is provided for driving each push rod and advantageously serves at the same time to support or guide the push rod.

In the present invention, the moving table with aerostatic bearing units, the base plate, and a portion of the push rods are received in a first vacuum chamber, or main chamber, and the drives, e.g., friction wheel drives, are arranged at least partially between the first, main chamber and second vacuum chambers, i.e., secondary chambers, having a higher pressure.

As was already mentioned, the free ends of the push rods project into the secondary chambers which are a component part of the suction arrangement of the aerostatic bearing units of the moving table and to which is connected a vacuum pump for pumping out the gas flowing out of the push rods into the
} secondary chambers. There is no need for flexible connection lines between the free ends of the friction rods and the vacuum pumps required for sucking out the operating gas. Accordingly, constraint forces are prevented from being transmitted to the moving table by way of the suction lines.

Dynamic gap seals with suction stages arranged therebetween are advantageously provided for sealing the main chamber relative to the secondary chamber. These dynamic gap seals are arranged as a single-stage or two-stage sealing system between an outer cylindrical housing part and an inner cylindrical housing part of the friction wheel gear unit which are supported so as to be rotatable relative to one another.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
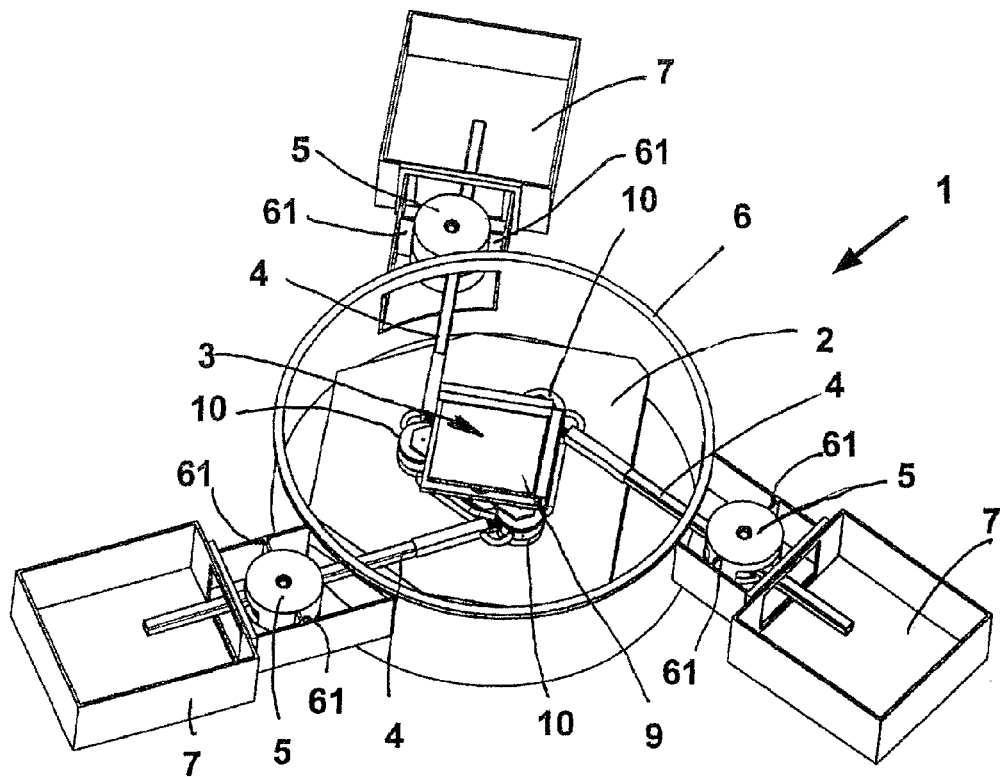
FIG. 1 shows a perspective view of the table system according to the invention.

The table system 1 shown in FIG. 1 comprises a base plate 2, a moving table 3 which is gas-guided on the base plate 2, and a guiding and driving system having three push rods 4 which act on the moving table 3 and have associated drives 5. The motors of the drives are not shown in more detail. The base plate 2, moving table 3 and, in part, the push rods 4 are received in a first vacuum chamber 6 designated as main chamber, while the drives 5 are located at least partially in a second vacuum chamber designated as secondary chamber 7, three of which are provided corresponding to the quantity of drives 5. The pressure inside the secondary chamber 7 is closer to atmospheric pressure than the pressure in the main chamber 6. The ends of the push rods 4 project into the secondary chamber 7. The secondary chamber 7 is connected to a vacuum pump, not shown, for exhausting gas.

The base plate 2 is constructed as a ceramic plate which is fitted to the bottom of the first cylindrical vacuum chamber, or main chamber 6, and which has a plane, machined surface as a reference for the moving table 3 in z-direction. The moving table 3 comprises a torsionally rigid, triangular frame construction 8 to which are fastened a stage plate 9, three aerostatic bearing units 10 and a preloading unit 11, e.g., an electrostatic preloading unit (see FIG. 2). The aerostatic bearing units 10 are connected to one another by suction lines 12 for two suction stages as will be described in more detail in the following.

Figure 3:
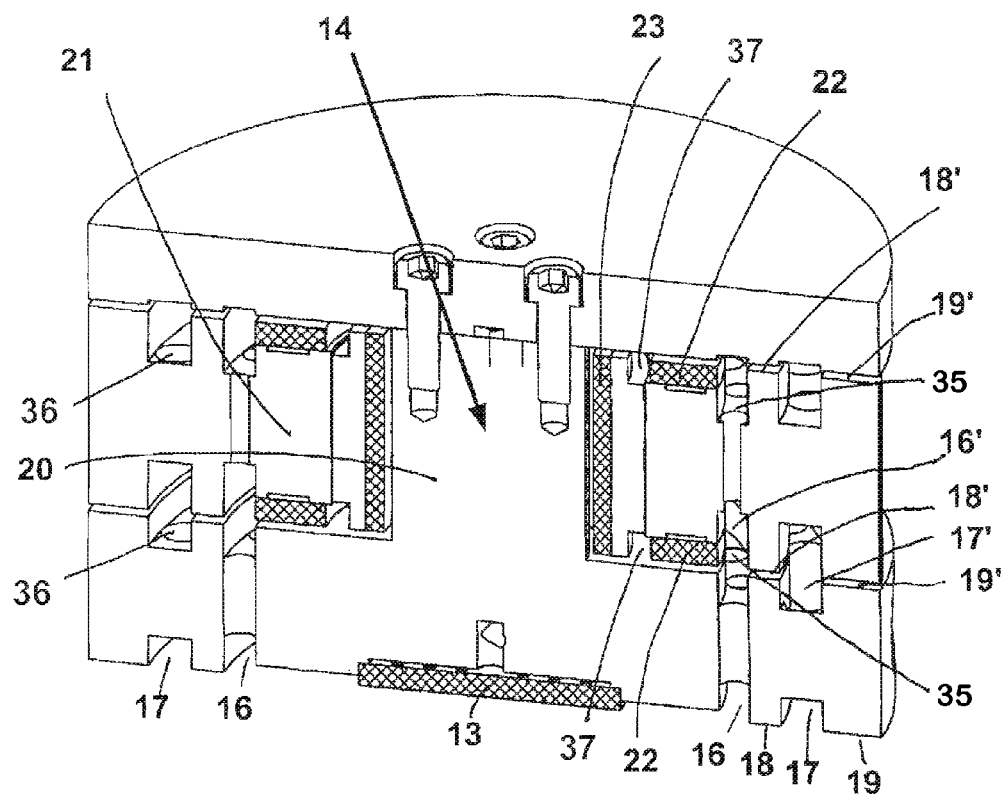
FIG. 3 shows a perspective sectional view through an aerostatic bearing unit with integrated swivel joint which is used in the table system according to the invention.
Figure 4:
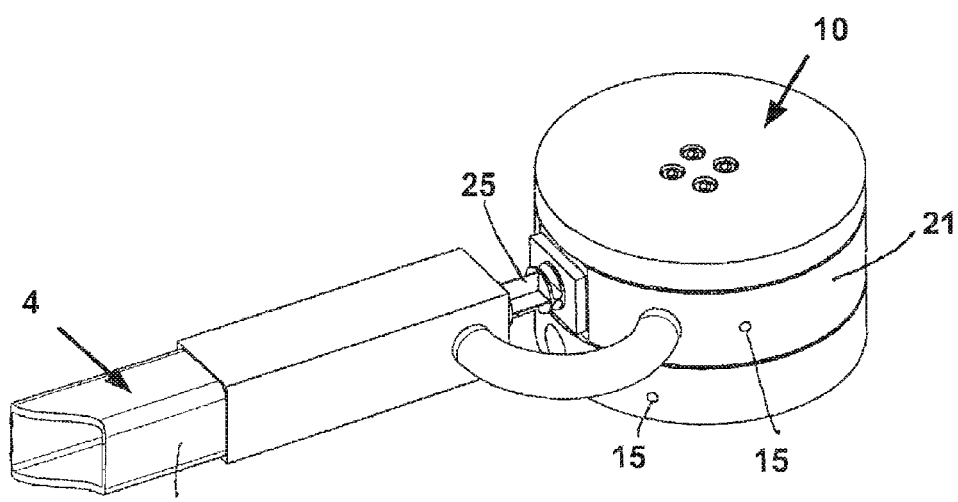
FIG. 4 shows a perspective view of a bearing unit according to FIG. 3 with a coupling element to a push rod.

The aerostatic bearing units 10 mounted at the three corners of the frame 8 are depicted in FIG. 3 which shows a section in z-direction at the greatest diameter of the bearing units 10. The cylindrical aerostatic bearing unit 10 in the embodiment example has, at its underside facing the base plate 2, a plane aerostatic bearing element 13 as supporting member of the bearing unit 10 below which the supporting air film or gas film is formed. The aerostatic bearing element 13 is connected to gas supply lines, not shown, which are guided through the base body 14 of the bearing unit 10. The connection ports 15 for the operating gas conducted to the bearing units via flexible hose lines can be seen on the side of the base body 14 (FIG. 4). The operating gas, which is under pressure, is distributed, e.g., via a porous material or individual nozzles which are a component part of the gas bearing element 13, into a gap between the aerostatic bearing element 13 and the base plate 2. The aerostatic bearing element 13 is surrounded by a first suction channel 16 and a second suction channel 17. A first sealing surface 18 and a second sealing surface 19 which, together, in conjunction with the base plate 2, form a two-stage sealing system having two suction channels and two sealing gaps are provided between the suction channels 16, 17 and adjoining the suction channel 17. The first suction channel 16 and the first sealing gap with sealing surface 18 serve as a first suction stage for a first vacuum in the pressure range between $10^3$ torr and $10^{-2}$ torr, and the second suction channel 17 and second sealing gap with sealing surface 19 serve as a second suction stage for a second vacuum in a pressure range between $10^{-1}$ torr and $10^{-6}$ torr.

An aerostatic swivel joint is formed at the same time inside the aerostatic bearing unit 10. To this end, the base body 14 is shaped as a double-T, the center part 20 serving as an axial part for a rotatable ring 21. The rotatable ring 21 is supported radially by an aerostatic bearing bushing 23 and axially by annular aerostatic bearing elements 22. A two-stage sealing system with suction channels 16', 17' and sealing gaps 18', 19' corresponding to the sealing system described above in connection with the aerostatic bearing element 13 is likewise provided for the axial bearings. The aerostatic bearing elements 22 and the bearing bushings 23 are in turn connected to gas supply lines, not shown, which are guided through the base body 14 of the bearing unit 18. Inside the bearing unit 10, the suction channels 16', 17' are connected to suction channels 16, 17 and to the pipe lines 12 by connection bore holes 35, 36. In an advantageous manner, another suction channel 37 is formed between the bearing bushing 23 and axial bearings 22 and can be connected to the suction lines or channels of the first suction stage or, via a flexible line, to normal atmosphere.

Figure 2:
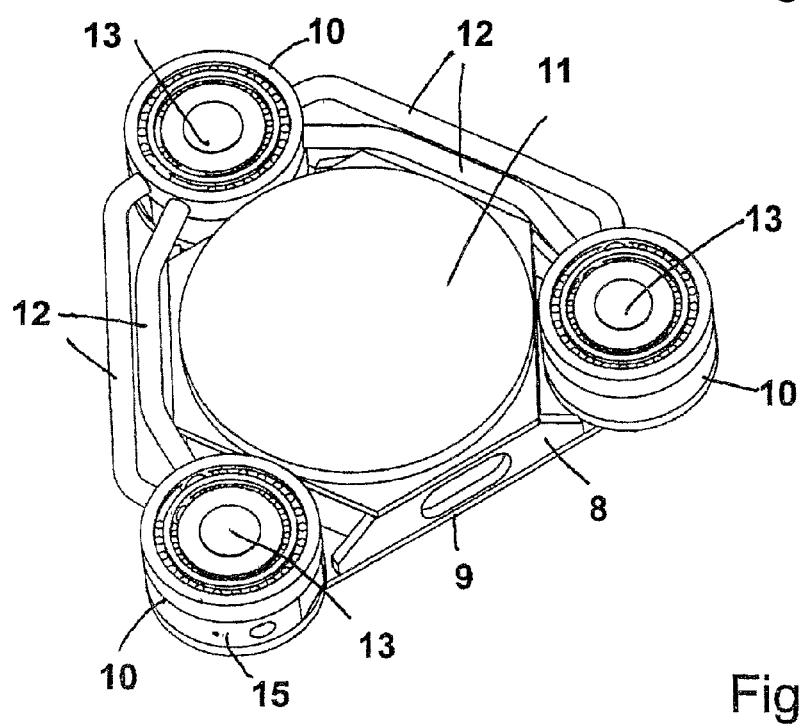
FIG. 2 shows a perspective bottom view of the moving table of the table system according to the invention.

As can be seen from FIGS. 1 and 2, the aerostatic bearing elements 13 of the three aerostatic bearing units 10 are supported on the base plate 2 and receive the load of the moving table in z-direction. The electrostatic preloading unit 11 is fastened to the underside of the frame 8 in order to achieve better static and dynamic properties for the moving table. This electrostatic preloading unit 11 preloads the aerostatic bearing elements 13 of the moving table based on an electrostatic force acting between the preloading unit 11 and the base plate. Preloading units based on other physical principles are also conceivable. The preloading unit 11 is arranged medially between the bearing units 10, but it is also conceivable to provide a plurality of preloading units, each of which is associated with a bearing element. To achieve the electrostatic force, an electrode system is provided. Two electrodes at different potentials can be arranged in or on the plate-shaped preloading unit itself, or one of the electrodes is formed by the base plate 2 as a counterelectrode in such a way that the unit acts as a plate capacitor.

The moving table 3 is guided laterally by means of the three push rods 4 which are connected to the center rings 21 of the aerostatic bearing units 10 according to FIG. 4. The push rods 4 comprise a hollow ceramic pipe 24 with a rectangular or square cross section and a coupling element 25 which is fastened to the ring 21 by a swivel joint and a torsion joint in the form of solid state joints. The swivel joint of the coupling element 25 enables a rotation around an axis parallel to the x-y plane and perpendicular to the longitudinal axis of the push rod 4. The torsion joint enables rotation around an axis parallel to the longitudinal axis of the push rod 4. The operating gas sucked out of the bearing units 10 reaches the secondary chamber 7 through the hollow push rod 4. One of the push rods conducts the gas of the first suction stage and two of the push rods conduct the gas of the second suction stage. The gas flows freely into the secondary chamber 7 through the open ends of the push rods 4 and is pumped out of the secondary chamber 7 by vacuum pumps.

In another embodiment form, not shown, an additional pipe, preferably formed as a rigid pipe, is arranged inside the hollow push rod 4 to supply the operating gas.

Each of the three push rods 4 is driven separately by drives 5, the respective push rod being supported or guided at the position of the drive 5. In combination with the moving table 3, they form a linkage (parallel kinematics). When the moving table 3 is situated in the center of the movement area (FIG. 1), the push rods 4 are arranged tangential to the reference circle of the bearing units of the moving table 3 and form an angle of 120° relative to one another. However, other arrangements of the push rods are also possible. The drives 5 are fixedly mounted at the vacuum chamber 7. The associated motors can be located outside the vacuum chambers 6, 7, and the actual gear unit of the drive 5, which is constructed in this instance as a friction wheel gear unit, is located within the vacuum chambers 6, 7. The driveshaft of the motor is sealed by a feedthrough with ferrofluidic seal at the crossover between normal atmosphere and vacuum.

Figure 5:
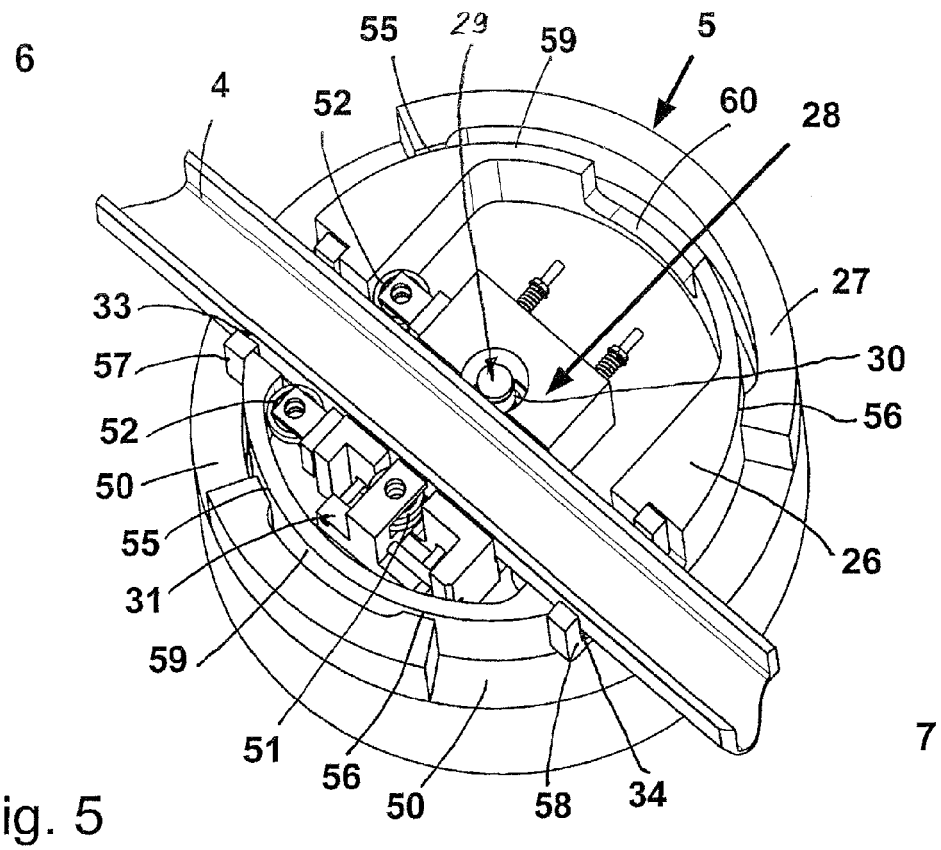
FIG. 5 shows a schematic view of part of the friction wheel gear unit with a friction wheel and bearing.
Figure 6:
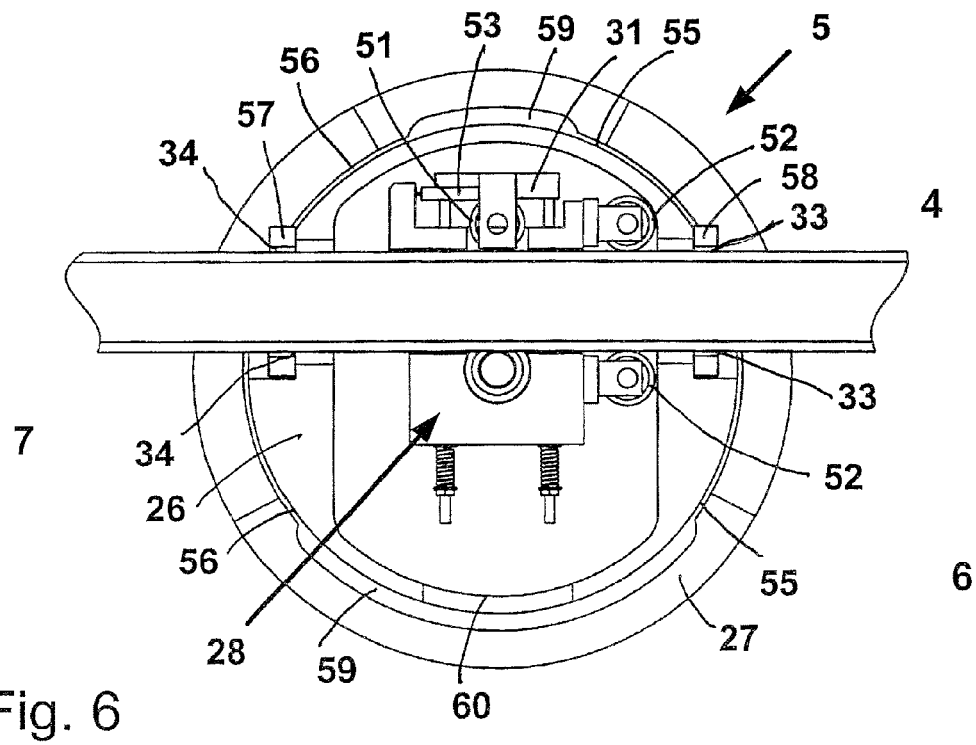
FIG. 6 shows a schematic top view of a friction wheel gear unit with part of a push rod.

FIGS. 5 and 6 show a friction wheel gear unit which is used for drive 5 and which comprises two nested housing parts 26, 27. The inner housing part 26 is cylindrical and is rotatably supported in the outer housing part 27. The actual friction wheel arrangement 28 is fastened in the inner housing part 26 through which the push rod 4 passes. In an advantageous manner, the friction wheel 30 and the driveshaft 29 to which the motor is connected are constructed as one part. During the movement of the moving table 3, the inner housing part 26 rotates in the outer housing part 27. Cutouts 50 are provided in the outer housing part corresponding to the swiveling path of the push rods 4 for the push rods 4 which swivel with the inner housing part 26 around the friction wheel 30. Ball bearings 52 which ensure the rotation of the inner housing part of the friction wheel gear unit with the push rod 4 are arranged at the inner housing part 26 of the friction wheel gear unit. The required pressing force of the push rod 4 against the friction wheel 30 is achieved by means of a pressure element 31 with radial ball bearings 51 (see FIG. 5) which is spring-mounted at the push rod 4. The pressure element 31 is mounted at the inner housing part 26 by means of solid state joints 53 and has the degree of freedom in direction of the contact pressing force. The other degrees of freedom are substantially blocked. In this way, the push rod 4 is supported in z-direction. With this bearing support principle, the weight force of the push rod 4 acts as an alternating load on the moving table 3. It depends upon the spacing of the respective bearing points (friction wheel gear unit and aerostatic bearing unit) and push rod position. The coupling element 25 described above is provided for preventing the transmission of unwanted movements to the moving table 3.

In another embodiment example, the push rod 4 is guided within the drive unit. To this end, a wraparound support of the push rod 4 in z-direction is provided at both sides of the friction arrangement 28 at a distance from the driveshaft 29 by two ball bearings. With this principle, only a far smaller portion of the weight force of the push rod 4 acts as an alternating load on the moving table 3. In this solution, the coupling element 25 between the push rod 4 and aerostatic bearing unit 10 must be expanded by an additional swivel joint parallel to and at a distance from the first swivel joint in order to compensate for an offset between the axis of the push rod and the connection point of the coupling element 25 to the bearing unit 10.

The inner housing part 26 of the friction wheel gear unit is rotatably supported in the outer housing part 27 also by bearing elements, not shown in more detail, which are preferably located outside the vacuum. A sealing system is likewise provided between the housing parts. Sealing gaps 55 are formed between the inner wall of the housing part 27 and the outer wall of the inner housing part 26. These gap seals 55 form a single-stage sealing system and serve to seal the respective secondary chamber 7 relative to the main chamber 6. Further, gap seals 33 are provided for the longitudinal movement of the push rod 4, and sealing elements 57 are fastened to the inner housing part 26 on the side of the main chamber 6 in each instance. An inner contour corresponding to the outer contour of the cross section of the push rod 4, plus the dimension of the sealing gap 33, is incorporated in the sealing element 57.

In case the pressure difference between the main chamber 6 and the secondary chamber 7 results in an excessive flow out of the secondary chamber 7 into the main chamber 6, a two-stage sealing system is used for sealing instead of the single-stage sealing system between the chambers. An additional sealing element 58 is fastened to the inner housing part 26 on the side of the secondary chamber 7, another gap seal 34 for the longitudinal movement of the push rod 4 being formed by this additional sealing element 58. Another gap seal 56 is inserted between the inner housing part 26 and the outer housing part 27. A suction channel 59 which is connected to the interior of the inner housing part 26 by an opening 60 is located between the gap seals 55, 56. In this way, the interior of the inner housing part 26 is sealed by gap seals 33, 57; 34, 58 relative to the main chamber 6 and relative to the secondary chamber 7 so that a third vacuum chamber is created as an intermediate chamber between the main chamber 6 and secondary chamber 7. This third vacuum chamber comprises the inner area of the inner housing part 26 and can be evacuated by a separate pump.

The outer housing part 27 is statically sealed, i.e., by walls 61 (FIG. 1), relative to the main chamber 6 inside the secondary chamber 7.

While this invention has been particularly shown and described with references to preferred embodiments thereof, it will be understood by those skilled in the art that various changes in form and details may be made therein without departing from the scope of the invention encompassed by the appended claims.

What is claimed is:

1. A table system for vacuum application comprising:
 a base plate;
 aerostatic bearing units;
 a moving table guided by the aerostatic bearing units;
  each aerostatic bearing unit comprising:
   connection ports for supplying and extracting gas;
   a sealing system comprising at least one stage comprising a suction channel and a sealing gap; and
   a swivel joint comprising a rotating part and a stationary part;
 drives; and
 drive-actuated hollow push rods connected to the rotating parts of the swivel joints, guiding the moving table laterally, and extracting the gas by suction.

2. The table system according to claim 1, further comprising:
 a first vacuum chamber; and
 at least one second vacuum chamber having a higher pressure than the first vacuum chamber;
 wherein the moving table, the aerostatic bearing units, the base plate, and a portion of each of the push rods are positioned in the first vacuum chamber; and
 wherein each drive is positioned partially in the first vacuum chamber and partially in the at least one second vacuum chamber.

3. The table system according to claim 2,
 wherein ends of the push rods opposite from the swivel joints terminate in the at least one second vacuum chamber; and
 wherein the at least one second vacuum chamber is separated from the first vacuum chamber.

4. The table system according to claim 1, wherein the moving table comprises a torsionally rigid frame attached to the aerostatic bearing units.

5. The table system according to claim 1, wherein each aerostatic bearing unit further comprises aerostatic bearing elements supporting the rotating part relative to the stationary part.

6. The table system according to claim 1,
 wherein each aerostatic bearing unit further comprises aerostatic bearing elements supporting the rotating part axially relative to the stationary part;
 wherein the stationary part is T-shaped in axial cross section, and
 wherein the rotating part is a rotatable ring.

7. The table system according to claim 1, further comprising pipe lines connecting the suction channels.

8. The table system according to claim 1, comprising at least three push rods,
 wherein two push rods conduct the gas at a lower pressure than the third push rod.

9. The table system according to claim 1, further comprising coupling elements permitting rotation and torsion and connecting each push rod to the rotating part.

10. The table system according to claim 4, further comprising a preloading device on the frame facing the base plate for applying a force to the base plate.

11. The table system according to claim 1, wherein each drive comprises a motor-driven rotatably supported friction wheel gear unit.

12. The table system according to claim 2, further comprising a sealing system comprising at least one stage and a sealing gap between the first vacuum chamber and the at least one second vacuum chamber.

13. The table system according to claim 12, comprising a two-stage sealing system with intermediate suction between the first vacuum chamber and the at least one second vacuum chamber.

14. The table system according to claim 11, wherein the friction wheel gear unit comprises an outer housing part and an inner housing part rotatably supported in the outer housing part.

15. The table system according to claim 14, further comprising a single-stage sealing system between the inner housing part and the outer housing part.

16. The table system according to claim 14, wherein the push rods are guided through the inner housing parts and are rotatably supported in the inner housing parts.

17. The table system according to claim 1,
 wherein at least one push rod supplies media to the moving table through the at least one push rod or
 wherein at least one push rod comprises one or more internal lines for supplying media to the moving table.

* * * * *